United States Patent
Chao et al.

(10) Patent No.: US 8,415,979 B2
(45) Date of Patent: Apr. 9, 2013

(54) DIFFERENTIAL DRIVER WITH CALIBRATION CIRCUIT AND RELATED CALIBRATION METHOD

(75) Inventors: Kuan-Hua Chao, Taipei (TW); Yan-Bin Luo, Taipei (TW); Tse-Hsiang Hsu, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 98 days.

(21) Appl. No.: 12/940,033

(22) Filed: Nov. 4, 2010

(65) Prior Publication Data
US 2012/0112794 A1    May 10, 2012

(51) Int. Cl.
*H03K 19/0175* (2006.01)

(52) U.S. Cl. .......................... 326/82; 327/108

(58) Field of Classification Search .............. 327/147, 327/156, 108; 326/30–34, 82
See application file for complete search history.

(56) References Cited

U.S. PATENT DOCUMENTS

| | | | |
|---|---|---|---|
| 6,075,407 A | 6/2000 | Doyle | |
| RE36,781 E * | 7/2000 | Lee et al. | 327/65 |
| 6,586,964 B1 | 7/2003 | Kent | |
| 6,885,958 B2 | 4/2005 | Yaklin | |
| 6,897,714 B2 | 5/2005 | Mori | |
| 6,968,167 B1 | 11/2005 | Wu | |
| 6,983,135 B1 | 1/2006 | Tsai | |
| 7,126,345 B2 | 10/2006 | Seidel | |
| 7,248,077 B2 * | 7/2007 | Park | 326/83 |
| 7,453,252 B1 | 11/2008 | Megaw | |
| 7,656,198 B1 * | 2/2010 | Zhou et al. | 326/115 |
| 7,962,116 B1 | 6/2011 | Tsai | |
| 8,183,849 B2 | 5/2012 | Wu | |
| 2003/0085737 A1 * | 5/2003 | Tinsley et al. | 326/86 |
| 2010/0289462 A1 | 11/2010 | Wu | |
| 2010/0315120 A1 * | 12/2010 | Wu et al. | 326/30 |
| 2011/0050280 A1 * | 3/2011 | Maddux et al. | 326/30 |
| 2011/0109344 A1 * | 5/2011 | Choi et al. | 326/30 |
| 2011/0241726 A1 * | 10/2011 | Kim et al. | 326/30 |
| 2011/0242916 A1 * | 10/2011 | Seol et al. | 365/198 |
| 2012/0062275 A1 * | 3/2012 | Hiraki et al. | 326/30 |
| 2012/0169380 A1 * | 7/2012 | Kang | 327/108 |
| 2012/0217991 A1 * | 8/2012 | Jang et al. | 326/30 |

FOREIGN PATENT DOCUMENTS

| | | |
|---|---|---|
| JP | 200358263 | 2/2003 |
| TW | 200741226 | 11/2007 |

\* cited by examiner

*Primary Examiner* — Adam Houston
(74) *Attorney, Agent, or Firm* — Winston Hsu; Scott Margo

(57) ABSTRACT

A calibration circuit for calibrating a differential driver with a differential output port including a first output node and a second output node includes: a comparing circuit arranged to receive a first output voltage corresponding to the first output node and a second output voltage corresponding to the second output node, and generate a comparison result according to the first output voltage, the second output voltage, and a predetermined voltage; and a controlling circuit coupled to the comparing circuit, a first resistive element and a second resistive element. The controlling circuit is arranged to adjust the first resistive element and the second resistive element according to the comparison result, wherein the first resistive element is coupled between the first output node and a reference voltage, and the second resistive element is coupled between the second output node and the reference voltage.

23 Claims, 3 Drawing Sheets

DIFFERENTIAL DRIVER WITH CALIBRATION CIRCUIT AND RELATED CALIBRATION METHOD

BACKGROUND OF THE INVENTION

1. Field of the Invention

The present invention relates to a differential driver with a calibration circuit and a related calibration method, and more particularly to a calibration circuit directly calibrating the deviated output resistive elements of the differential driver and a related calibration method.

2. Description of the Prior Art

Passive elements, such as resistors and capacitors, are critical elements in an integrated circuit. In a differential driving stage, there are two loading resistors utilized for matching the impedance looking to the transmission line which is coupled to the output port of the differential driving stage. Ideally, the resistance values of the loading resistors should be equal to each other. The resistances, however, may differ from the ideal value after fabrication due to process variations. If the resistance values of the loading resistors deviate from the predetermined value, the impedance matching condition between the loading resistors and the transmission line may fail, and consequently a reflected signal may be induced when the differential driving stage outputs a differential output signal to the transmission line via the output port. More specifically, the reflected signal may deteriorate the quality, such as linearity, of the differential output signal. Therefore, a mechanism is required to acquire and calibrate the deviation of passive elements in the integrated circuit.

SUMMARY OF THE INVENTION

One of the objectives of the present invention is therefore to provide a differential driver with a calibration circuit to directly calibrate the deviated output resistive elements of the differential driver, and a calibration method thereof.

According to a first embodiment of the present invention, a calibration circuit for calibrating a differential driver with a differential output port including a first output node and a second output node is disclosed. The calibration circuit comprises a comparing circuit and a controlling circuit. The comparing circuit is arranged to receive a first output voltage corresponding to the first output node and a second output voltage corresponding to the second output node, and generate a comparison result according to the first output voltage, the second output voltage, and a predetermined voltage. The controlling circuit is coupled to the comparing circuit, a first resistive element and a second resistive element. The controlling circuit is arranged to adjust the first resistive element and the second resistive element according to the comparison result, wherein the first resistive element is coupled between the first output node and a reference voltage, and the second resistive element is coupled between the second output node and the reference voltage.

According to a second embodiment of the present invention, a differential driver is disclosed. The differential driver comprises a first current source, a differential pair input circuit, a first resistive element, a second resistive element, and a calibration circuit. The first current source has a first node coupled to a first reference voltage. The differential pair input circuit has a common node coupled to a second node of the first current source. The first resistive element has a first node coupled to a first output node of the differential pair input circuit, and a second node coupled to a second reference voltage. The second resistive element has a first node coupled to a second output node of the differential pair input circuit, and a second node coupled to the second reference voltage, wherein the first output node and the second output node act as a differential output port of the differential driver. The calibration circuit is arranged to adjust the first resistive element and the second resistive element according to a first output voltage corresponding to the first output node, a second output voltage corresponding to the second output node, and a predetermined voltage.

According to a third embodiment of the present invention, a calibration method for calibrating a differential driver with a differential output port including a first output node and a second output node is disclosed. The calibration method comprises: receiving a first output voltage corresponding to the first output node and a second output voltage corresponding to the second output node; generating a comparison result according to the first output voltage, the second output voltage, and a predetermined voltage; and adjusting a first resistive element and a second resistive element according to the comparison result, wherein the first resistive element is coupled between the first output node and a reference voltage, and the second resistive element is coupled between the second output node and the reference voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
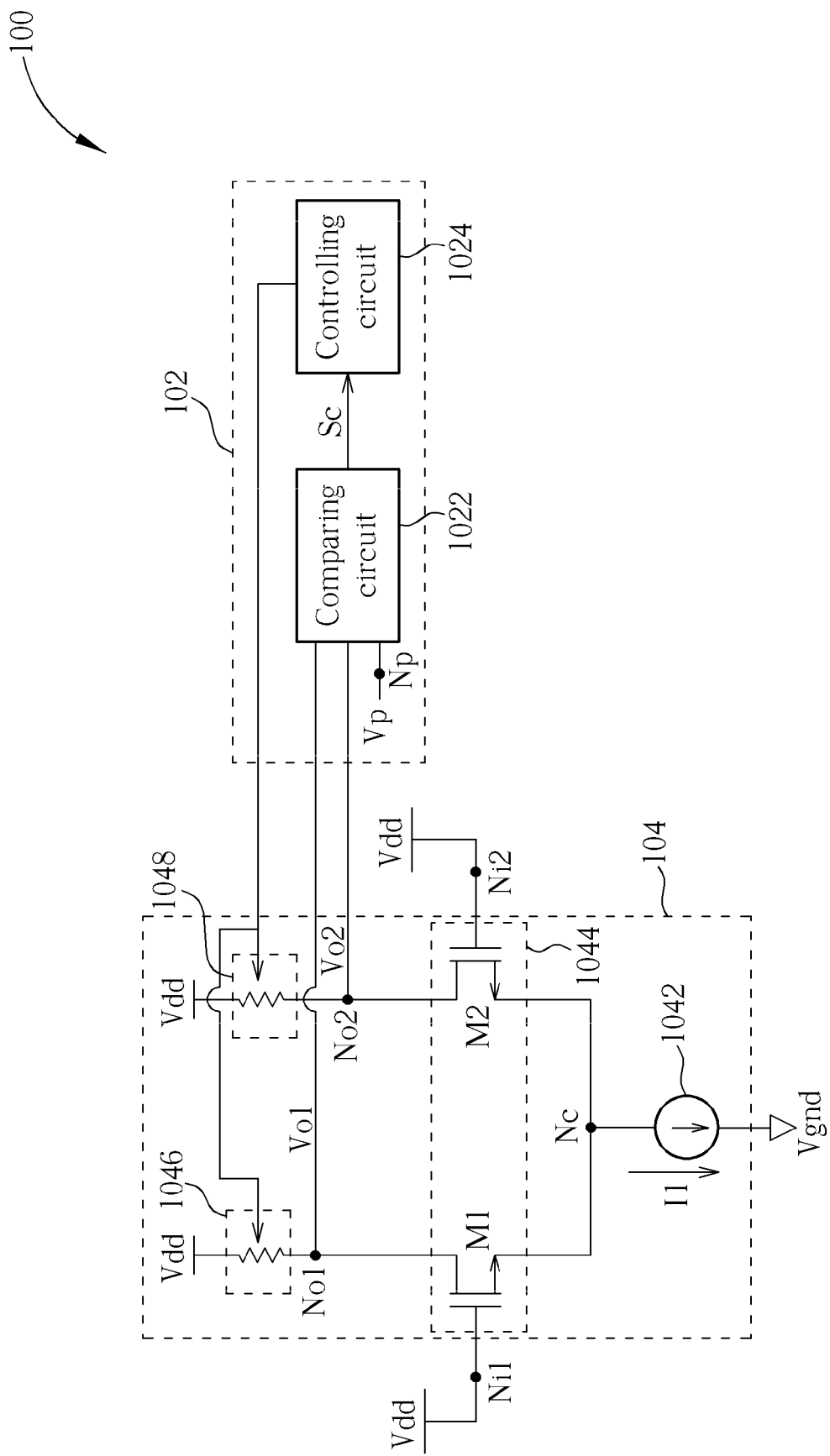
FIG. 1 is a diagram illustrating a differential driver according to an embodiment of the present invention.

Please refer to FIG. 1. FIG. 1 is a diagram illustrating a differential driver 100 according to an embodiment of the present invention. The differential driver 100 comprises a calibration circuit 102 and a driving circuit 104. The driving circuit 104 comprises a first current source 1042, a differential pair input circuit 1044, a first resistive element 1046, and a second resistive element 1048. The first current source 1042 has a first node coupled to a first reference voltage, e.g., the ground voltage Vgnd. The differential pair input circuit 1044 has a common node Nc coupled to a second node of the first current source 1042. The first resistive element 1046 has a first node coupled to a first output node No1 of the differential pair input circuit 1044, and a second node coupled to a second reference voltage, e.g., the supply voltage Vdd. The second resistive element 1048 has a first node coupled to a second output node No2 of the differential pair input circuit 1044, and a second node coupled to the second reference voltage Vdd, wherein the first output node No1 and the second output node No2 act as a differential output port of the differential driver 100. The differential pair input circuit 1044 comprises a first transistor M1 and a second transistor M2, wherein the first transistor M1 and the second transistor M2 are N-type transistors. The first transistor M1 comprises a first node coupled to the second node, i.e., Nc, of the first current source 1042, and a second node coupled to the first node, i.e., No1, of the first resistive element 1046, and the second transistor M2 comprises a first node coupled to the second node, i.e., Nc, of the first current source 1042, and a second node coupled to the first node, i.e., No2, of the second resistive element 1048. Furthermore, the differential pair input circuit 1044 has a differential input port including a first input node Ni1 and a second input node Ni2. In this embodiment, the first input node Ni1 is the gate node of the first transistor M1 and the second input node Ni2 is the gate node of the second transistor M2.

The calibration circuit 102 is arranged to adjust the first resistive element 1046 and the second resistive element 1048 according to a first output voltage Vo1 corresponding to the first output node No1, a second output voltage Vo2 corresponding to the second output node No2, and a predetermined voltage Vp. The calibration circuit 102 further comprises a comparing circuit 1022 and a controlling circuit 1024. The comparing circuit 1022 is arranged to receive the first output voltage Vo1 corresponding to the first output node No1 and a second output voltage Vo2 corresponding to the second output node No2, and generate a comparison result Sc according to the first output voltage Vo1, the second output voltage Vo2, and the predetermined voltage Vp. The controlling circuit 1024 is coupled to the comparing circuit 1022, the first resistive element 1046 and the second resistive element 1048. The controlling circuit 1024 is arranged to adjust the first resistive element 1046 and the second resistive element 1048 according to the comparison result Sc.

When the differential driver 100 is fabricated under a specific semiconductor process, the resistive values R1, R2 of the first resistive element 1046 and the second resistive element 1048, respectively, may deviate from the predetermined resistive values, wherein the predetermined resistive values are designed for matching the impedance of the transmission line (not shown) coupled to the differential output port of the differential driver 100. Therefore, when the resistive values R1, R2 of the first resistive element 1046 and the second resistive element 1048 deviate from the predetermined resistive values, the calibration circuit 102 is employed to calibrate the resistive values R1, R2 of the first resistive element 1046 and the second resistive element 1048 to the predetermined resistive values. According to the present invention, when the calibration circuit 102 calibrates the first resistive element 1046 and the second resistive element 1048, the first input node Ni1 and the second input node Ni2 of the differential driver 100 are coupled to a same voltage such that a current I1 generated by the first current source 1042 is divided substantially equally by a first current path, which consists of the first transistor M1 and the first resistive element 1046, and a second current path, which consists of the second transistor M2 and the second resistive element 1048. Please note that, for brevity, the first input node Ni1 and the second input node Ni2 are coupled to the second reference voltage Vdd in this embodiment as shown in FIG. 1. It is also should be noted that the first input node Ni1 and the second input node Ni2 are utilized for receiving a pre-drive differential signal pair when the differential driver 100 is under a normal driving mode.

Please note that, although the first output voltage Vo1 in FIG. 1 is shown to be the voltage level at the first output node No1 and the second output voltage Vo2 in FIG. 1 is shown to be the voltage level at the second output node No2, the present invention is not limited thereto. For example, the first output voltage Vo1 can be the voltage drop across the first resistive element 1046, and the second output voltage Vo2 can be the voltage drop across the second resistive element 1048. The second embodiment is achievable with slight modification on the value of the predetermined voltage Vp with compared to the first embodiment.

Following takes FIG. 1 as an example to explain the operation of the calibration process. The comparing circuit 1022 receives the first output voltage Vo1 at the first output node No1 and the second output voltage Vo2 at the second output node No2, and generates a comparison result according to the first output voltage Vo1, the second output voltage Vo2, and the predetermined voltage Vp. Then the controlling circuit 1024 refers to the comparison result to simultaneously adjust the first resistive element 1046 and the second resistive element 1048 for calibrating R1 and R2 to a target value. In this embodiment, the predetermined voltage Vp is set to Vdd−Vref, wherein the voltage Vref is the predetermined voltage drop between the second reference voltage Vdd and the average voltage of the first output voltage Vo1 and the second output voltage Vo2. Therefore, the comparing circuit 1022 first receives the first output voltage Vo1 and the second output voltage Vo2 to generate an average voltage Va (e.g., 0.5*Vo1+0.5*Vo2), and then the comparing circuit 1022 compares the average voltage Va to the voltage Vp to generate the comparison result Sc. The comparing circuit 1022 can be implemented by three transistors, whose control nodes (e.g., gate nodes) respectively coupled to the first output voltage Vo1, the second output voltage Vo2 and the predetermined voltage Vp, and (W/L)1:(W/L)2:(W/L)p equals to 1:1:2, where (W/L)1 is the aspect ratio (W/L) of the first transistor receiving the first output voltage Vo1, (W/L)2 is the aspect ratio (W/L) of the second transistor receiving the second output voltage Vo2, and (W/L)p is the aspect ratio (W/L) of the third transistor receiving the predetermined voltage Vp.

Then, the controlling circuit 1024 receives the comparison result Sc and adjusts the resistive values R1, R2 of the first resistive element 1046 and the second resistive element 1048, according to the comparison result Sc. In other words, the calibration circuit 102 is arranged to adjust the resistive values R1, R2 for reducing a difference between the average voltage Va and the predetermined voltage Vp until the average voltage Va of the first output voltage Vo1 and the second output voltage Vo2 substantially equals the predetermined voltage Vp. It should be noted that, in this embodiment, the controlling circuit 1024 increases or reduces both of the resistive value R1 of the first resistive element 1046 and the resistive value R2 of the second resistive element 1048 for reducing the difference between the average voltage Va and the predetermined voltage Vp, thereby calibrating an average of R1 and R2 to a target value (2*Vref/I1). In this way, the mismatch between the first resistive element 1046 and the resistive value R2 can be compensated. Furthermore, the calibration circuit 102 directly adjusts both the first resistive element 1046 and the second resistive element 1048 in the differential driver 100 to calibrate the average resistive value of the deviated resistive values R1, R2 rather than adjusting the replica of the first resistive element 1046 and the second resistive element 1046 since the replica of the first resistive element 1046 and the second resistive element 1046 may also be mismatched to the first resistive element 1046 and the second resistive element 1048.

More specifically, when the comparison result Sc generated by the comparing circuit 1022 indicates that the average voltage Va of the first output voltage Vo1 and the second output voltage Vo2 is larger than the predetermined voltage Vp, the controlling circuit 1024 increases both of the resistive values R1 of the first resistive element 1046 and the resistive value R2 of the second resistive element 1048 for reducing the average voltage Va. When the comparison result Sc generated by the comparing circuit 1022 indicates that the average voltage Va of the first output voltage Vo1 and the second output voltage Vo2 is smaller than the predetermined voltage Vp, the controlling circuit 1024 decreases both of the resistive values R1 of the first resistive element 1046 and the resistive value R2 of the second resistive element 1048 for increasing the average voltage Va. Then, the comparing circuit 1022 compares the updated average voltage Va to the predetermined voltage Vp to generate an updated comparison result Sc for the controlling circuit 1024. In other words, the calibration circuit 102 compares the average voltage Va to the predetermined voltage Vp and adjusts the resistive values R1 of the first resistive element 1046 and the resistive value R2 of the second resistive element 1048 recursively until the average voltage Va of the first output voltage Vo1 and the second output voltage Vo2 substantially equals the predetermined voltage Vp.

In addition, the average voltage Va of the first output voltage Vo1 and the second output voltage Vo2 can be represented by the following equation:

$$Va=(Vdd-0.5*I1*R1+Vdd-0.5*I1*R2)/2 \qquad (1)$$

When the average voltage Va equals the predetermined voltage Vp, i.e.

$$Vdd-(0.5*I1*R1+0.5*I1*R2)/2=Vp,$$

$$0.5*R1+0.5*R2=(2*Vref)/I1;$$

wherein 0.5*R1+0.5*R2 is the average resistive value of the resistive values R1, R2. The average resistive value of the resistive values R1, R2 equals (2*Vref)/I1, which is a known value. Therefore, the average resistive value of the resistive values R1, R2 can be set via the setting of the predetermined voltage Vref and current I1. In other words, by adjusting the average voltage Va of the first output voltage Vo1 and the second output voltage Vo2 to equal the predetermined voltage Vp, the average resistive value of the deviated resistive values R1, R2 is calibrated to equal the input impedance looking into the above-mentioned transmission line. Therefore, the impedance mismatch problem of the differential driver 100 caused by the process variation is solved accordingly.

Figure 2:
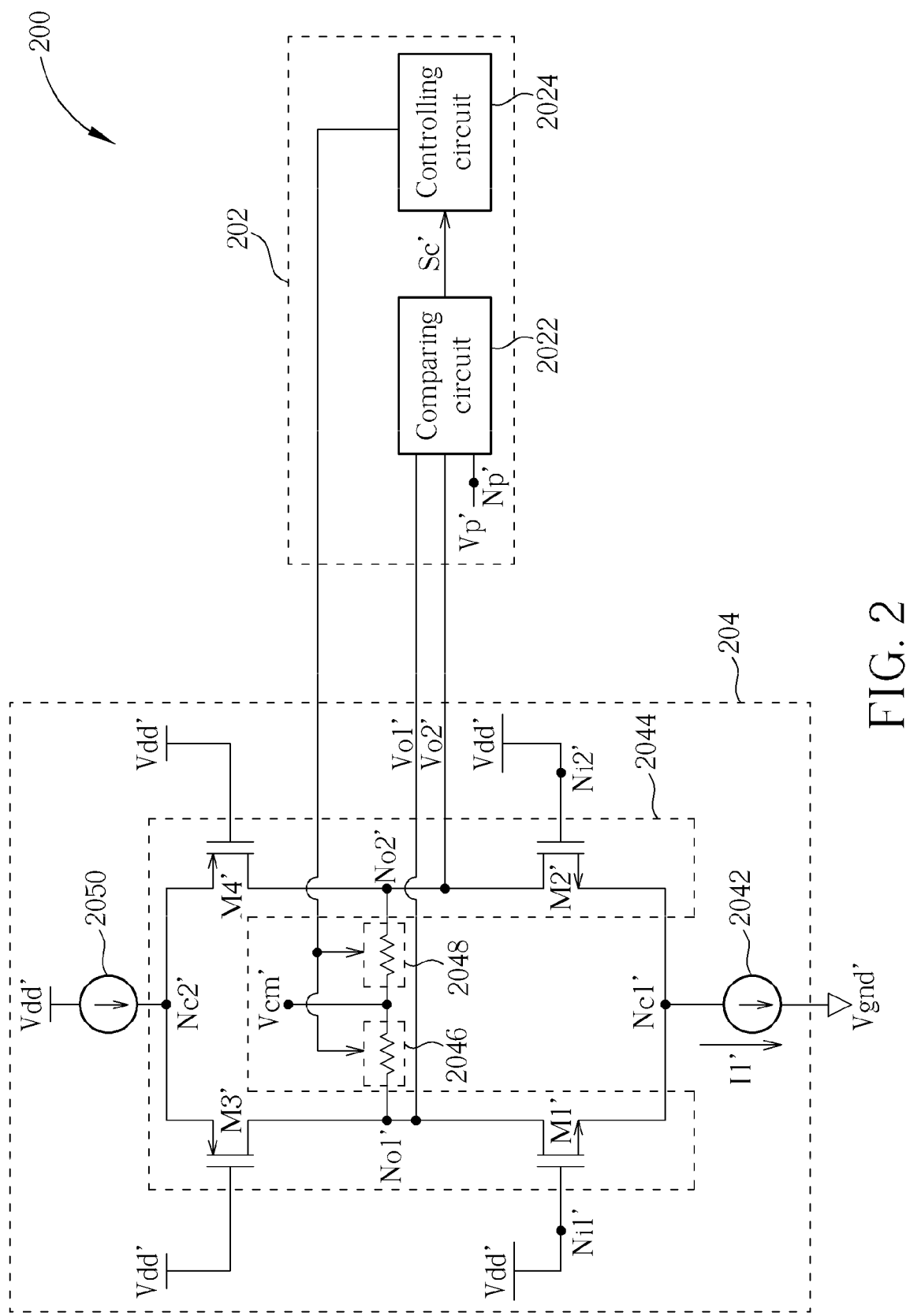
FIG. 2 is a diagram illustrating a differential driver according to a second embodiment of the present invention.

Please refer to FIG. 2. FIG. 2 is a diagram illustrating a differential driver 200 according to another embodiment of the present invention. The differential driver 200 comprises a calibration circuit 202 and a driving circuit 204. The driving circuit 204 is a so-called HBOX differential driver, which comprises a first current source 2042, a differential pair input circuit 2044, a first resistive element 2046, a second resistive element 2048, and a second current source 2050. The first current source 2042 has a first node coupled to a first reference voltage, e.g., the ground voltage Vgnd'. The differential pair input circuit 2044 has a common node Nc1' coupled to a second node of the first current source 2042. The first resistive element 2046 has a first node coupled to a first output node No1' of the differential pair input circuit 2044, and a second node coupled to a second reference voltage, e.g., the common mode voltage Vcm'. The second resistive element 2048 has a first node coupled to a second output node No2' of the differential pair input circuit 2044, and a second node coupled to the second reference voltage Vcm', wherein the first output node No1' and the second output node No2' act as a differential output port of the differential driver 200. The second current source 2050 has a first node coupled to a third reference voltage, e.g., the supply voltage Vdd'.

The differential pair input circuit 2044 comprises a first transistor M1', a second transistor M2', a third transistor M3', and a fourth transistor M4', wherein the first transistor M1' and the second transistor M2' are N-type transistors, and the third transistor M3' and the fourth transistor M4' are P-type transistors. The first transistor M1' has a first node coupled to the second node, i.e., Nc1', of the first current source 2042, and a second node coupled to the first node, i.e., No1', of the first resistive element 2046. The second transistor M2' has a first node coupled to the second node, i.e., Nc1', of the first current source 2042, and a second node coupled to the first node, i.e., No2', of the second resistive element 2048. The third transistor M3' has a first node coupled to a second node Nc2' of the second current source 2050, and a second node coupled to the first node, i.e., No1', of the first resistive element 2046. The fourth transistor M4' has a first node coupled to the second node Nc2' of the second current source 2050, and a second node coupled to the first node, i.e., No2' of the second resistive element 2048.

In addition, the calibration circuit 202 is arranged to adjust the first resistive element 2046 and the second resistive element 2048 according to a first output voltage Vo1' corresponding to the first output node No1', a second output voltage Vo2' corresponding to the second output node No2', and a predetermined voltage Vp'. Furthermore, the calibration circuit 202 comprises a comparing circuit 2022 and a controlling circuit 2024. The comparing circuit 2022 is arranged to receive the first output voltage Vo1' corresponding to the first output node No1' and a second output voltage Vo2' corresponding to the second output node No2', and generate a comparison result Sc' according to the first output voltage Vo1', the second output voltage Vo2', and the predetermined voltage Vp'. The controlling circuit 2024 is coupled to the comparing circuit 2022, the first resistive element 2046 and the second resistive element 2048, wherein the controlling circuit 2024 is arranged to adjust the first resistive element 2046 and the second resistive element 2048 according to the comparison result Sc'.

It should be noted that, when the differential driver 200 is under a normal driving mode, the gate node, i.e., the first input node Ni1', of the first transistor M1' is connected to the gate node of the third transistor M3', the gate node, i.e., the second input node Ni2', of the second transistor M2' is connected to the gate node of the fourth transistor M4', and the first input node Ni1' and the second input node Ni2 are utilized for receiving a pre-drive differential signal pair.

When the calibration circuit 202 calibrates the first resistive element 2046 and the second resistive element 2048, however, the gate node of the third transistor M3' and the gate node of the fourth transistor M4' are coupled to the third reference voltage Vdd' in order to turn off the third transistor M3', the fourth transistor M4' and the second current source 2050, and the gate node, i.e., the first input node Ni1', of the first transistor M1' and the gate node, i.e., the second input node Ni2', of the second transistor M2' are coupled to a same voltage such that a current I1' generated by the first current source 2042 is divided substantially equally by a first current path, which consists of the first transistor M1' and the first resistive element 2046, and a second current path, which consists of the second transistor M2' and the second resistive element 2048. Please note that, for brevity, the first input node Ni1' and the second input node Ni2' are coupled to the third reference voltage Vdd' in this embodiment as shown in FIG. 2.

Therefore, when the differential driver 200 is fabricated under a specific semiconductor process, the resistive values R1', R2' of the first resistive element 2046 and the second resistive element 2048, respectively, may deviate from the predetermined resistive values, wherein the predetermined resistive values are designed for matching the impedance of the transmission line (not shown) coupled to the differential output port of the differential driver 200. Therefore, when the resistive values R1', R2' of the first resistive element 2046 and the second resistive element 2048 deviate from the predetermined resistive values, the calibration circuit 202 is employed to calibrate the resistive values R1', R2' of the first resistive element 2046 and the second resistive element 2048 to the predetermined resistive values. It should be noted that, in this embodiment, when the calibration circuit 202 calibrates the first resistive element 2046 and the second resistive element 2048, the predetermined voltage Vp', which is inputted to a node Np' of the comparing circuit 2022, is set to Vcm'−Vref', wherein the voltage Vref' is the predetermined voltage drop between the second reference voltage Vcm' and the average voltage Va' of the first output voltage Vo1' and the second output voltage Vo2'.

Similar to the above-mentioned differential driver 100, the calibration circuit 202 is arranged to adjust the resistive values R1', R2' for reducing a difference between the average voltage Va' and the predetermined voltage Vp' until the average voltage Va' substantially equals the predetermined voltage Vp'. When the average voltage Va' is adjusted to equal the predetermined voltage Vp', the average resistive value of the deviated resistive values R1', R2' is calibrated to equal the input impedance looking into the above-mentioned transmission line. Therefore, the impedance mismatch problem of the differential driver 200 caused by the process variation is solved accordingly. Moreover, although the first output voltage Vo1 in FIG. 2 is shown to be the voltage level at the first output node No1 and the second output voltage Vo2 in FIG. 2 is shown to be the voltage level at the second output node No2, the present invention is not limited thereto. For example, the first output voltage Vo1 can be the voltage drop across the first resistive element 2046, and the second output voltage Vo2 can be the voltage drop across the second resistive element 2048. It is achievable with slight modification on the value of the predetermined voltage Vp. Since the operation of the calibration circuit 202 is similar to the operation related to the calibration circuit 102, the detailed description of the calibration circuit 202 is omitted here for brevity.

Figure 3:
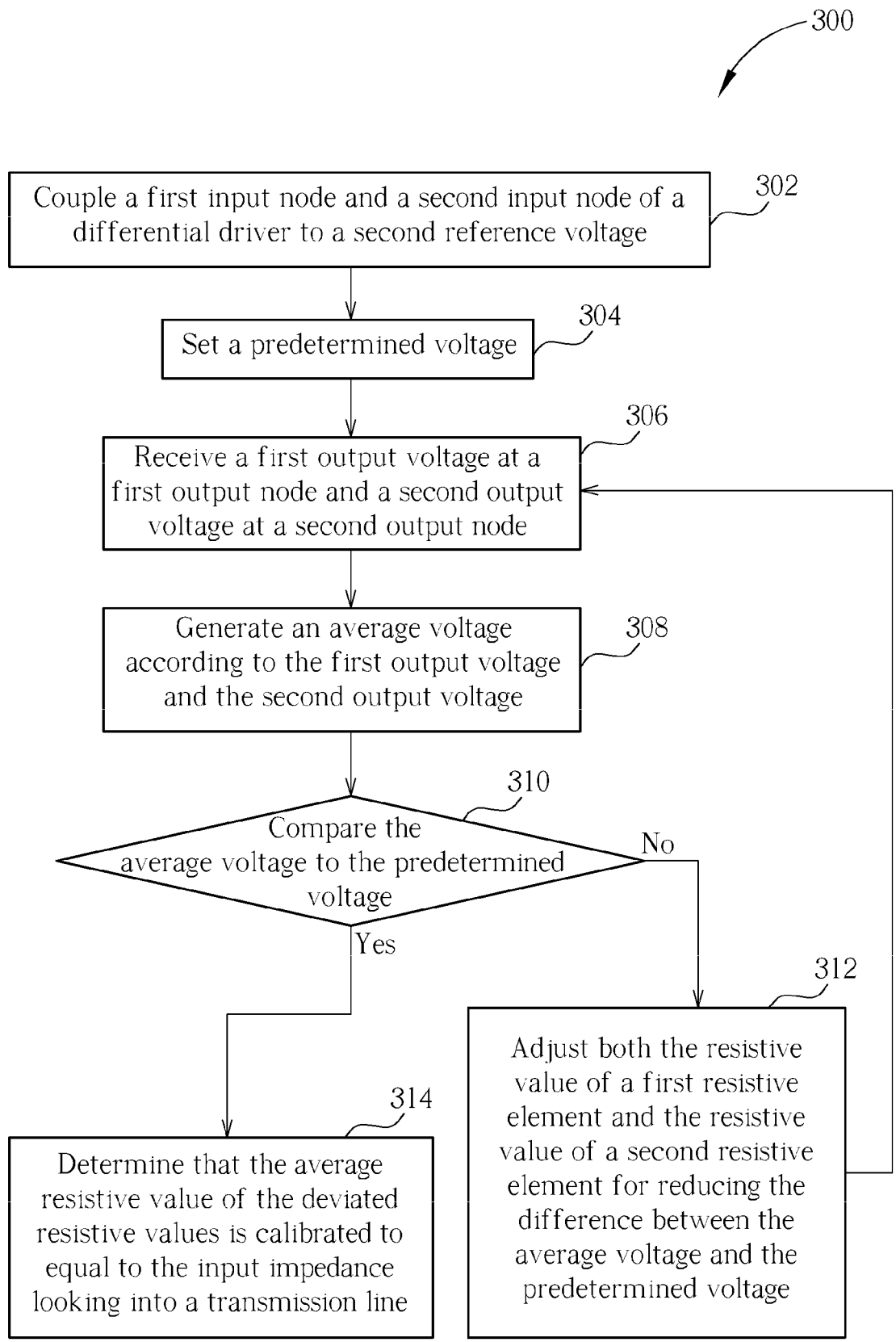
FIG. 3 is a flowchart illustrating a calibration method according to a third embodiment of the present invention.

Please refer to FIG. 3. FIG. 3 is a flowchart illustrating a calibration method 300 according to a third embodiment of the present invention. The calibration method 300 is for calibrating a differential driver with a differential output port including a first output node and a second output node. Therefore, for simplicity, the differential driver can be represented by the differential driver 100 (or 200) of the above mentioned embodiments. Furthermore, provided that substantially the same result is achieved, the steps of the flowchart shown in FIG. 3 need not be in the exact order shown and need not be contiguous, that is, other steps can be intermediate. The calibration method 300 comprises:

Step 302: Couple the first input node Ni1 and the second input node Ni2 of the differential driver 100 to the second reference voltage Vdd;

Step 304: Set the predetermined voltage Vp;

Step 306: Receive the first output voltage Vo1 corresponding to the first output node No1 and the second output voltage Vo2 corresponding to the second output node No2;

Step 308: Generate the average voltage Va according to the first output voltage Vo1 and the second output voltage Vo2;

Step 310: Compare the average voltage Va to the predetermined voltage Vp to determine if the average voltage Va equals the predetermined voltage Vp; if not go to step 312, if yes go to step 316;

Step 312: Adjust both the resistive value R1 of the first resistive element 1046 and the resistive value R2 of the second resistive element 1048 for reducing the difference between the average voltage Va and the predetermined voltage Vp, and go to step 306;

Step 314: Determine that the average resistive value of the deviated resistive values R1, R2 is calibrated to equal to the input impedance looking into the above-mentioned transmission line, and end the calibration.

In step 304, the predetermined voltage Vp can be set to Vcm−Vref, wherein the voltage Vref is the predetermined voltage drop between the second reference voltage Vcm and the average voltage Va of the first output voltage Vo1 and the second output voltage Vo2. Therefore, by recursively performing the steps 306-312 until the average voltage Va equals the predetermined voltage Vp, the average resistive value of the deviated resistive values R1, R2 is calibrated to equal (or be closer to) the input impedance looking into the above-mentioned transmission line. Accordingly, the impedance mismatch problem of the differential driver 100 caused by the process variation is solved.

To summarize, the present invention directly adjusts both the first resistive element and the second resistive element in the differential driver to calibrate the average resistive value of the deviated resistive values rather than adjusting only one of the first resistive element and the second resistive element or adjusting the replica of the first resistive element and the second resistive element.

Those skilled in the art will readily observe that numerous modifications and alterations of the device and method may be made while retaining the teachings of the invention.

What is claimed is:

1. A calibration circuit for calibrating a differential driver with a differential output port including a first output node and a second output node, the calibration circuit comprising:
    a comparing circuit, arranged to receive a first output voltage corresponding to the first output node and a second output voltage corresponding to the second output node, and generate a comparison result according to the first output voltage, the second output voltage, and a predetermined voltage; and
    a controlling circuit, coupled to the comparing circuit, a first resistive element and a second resistive element, the controlling circuit arranged to adjust the first resistive element and the second resistive element according to the comparison result, wherein the first resistive element is coupled between the first output node and a reference voltage, and the second resistive element is coupled between the second output node and the reference voltage;
wherein the differential driver further has a differential input port including a first input node and a second input node; and the first input node and the second input node of the differential driver are coupled to a same voltage when the calibration circuit calibrates the differential driver.

2. The calibration circuit of claim 1, wherein the controlling circuit refers to the comparison result to adjust both a resistive value of the first resistive element and a resistive value of the second resistive element for calibrating an average value of the resistive value of the first resistive element and the resistive value of the second resistive element to a target value.

3. The calibration circuit of claim 1, wherein the comparing circuit comprises:
   an average voltage estimating unit, arranged to generate an average voltage of the first output voltage and the second output voltage; and
   a comparing unit, coupled to the average voltage estimating unit, for generating the comparison result by comparing the average voltage with the predetermined voltage.

4. The calibration circuit of claim 3, wherein the controlling circuit refers to the comparison result to adjust a resistive value of the first resistive element and a resistive value of the second resistive element for reducing a difference between the average voltage and the predetermined voltage.

5. The calibration circuit of claim 4, wherein the controlling circuit adjusts the resistive value of the first resistive element and the resistive value of the second resistive element until the average voltage substantially equals the predetermined voltage.

6. The calibration circuit of claim 4, wherein the controlling circuit increases or reduces both of the resistive value of the first resistive element and the resistive value of the second resistive element.

7. A differential driver, comprising:
   a first current source, having a first node coupled to a first reference voltage;
   a differential pair input circuit, having a common node coupled to a second node of the first current source;
   a first resistive element, having a first node coupled to a first output node of the differential pair input circuit, and a second node coupled to a second reference voltage;
   a second resistive element, having a first node coupled to a second output node of the differential pair input circuit, and a second node coupled to the second reference voltage, wherein the first output node and the second output node act as a differential output port of the differential driver; and
   a calibration circuit, arranged to adjust the first resistive element and the second resistive element according to a first output voltage corresponding to the first output node, a second output voltage corresponding to the second output node, and a predetermined voltage;
   wherein the differential pair input circuit comprises a pair of control nodes which are coupled to a same voltage when the calibration circuit adjusts the first resistive element and the second resistive element.

8. The differential driver of claim 7, wherein the differential pair input circuit comprises:
   a first transistor, having a first node coupled to the second node of the first current source, and a second node coupled to the first node of the first resistive element;
   a second transistor, having a first node coupled to the second node of the first current source, and a second node coupled to the first node of the second resistive element;
   wherein when the calibration circuit adjusts the first resistive element and the second resistive element, a control node of the first transistor and a control node of the second transistor are coupled to the same voltage to turn on the first transistor and the second transistor, and the control node of the first transistor and the control node of the second transistor comprise the pair of control nodes of the differential pair input circuit.

9. The differential driver of claim 7, further comprising:
   a second current source, having a first node coupled to a third reference voltage;
   wherein the differential pair input circuit comprises:
   a first transistor, having a first node coupled to the second node of the first current source, and a second node coupled to the first node of the first resistive element;
   a second transistor, having a first node coupled to the second node of the first current source, and a second node coupled to the first node of the second resistive element;
   a third transistor, having a first node coupled to a second node of the second current source, and a second node coupled to the first node of the first resistive element; and
   a fourth transistor, having a first node coupled to the second node of the second current source, and a second node coupled to the first node of the second resistive element;
   wherein when the calibration circuit adjusts the first resistive element and the second resistive element, a control node of the first transistor and a control node of the second transistor are coupled to the same voltage to turn on the first transistor and the second transistor, while the third transistor and the fourth transistor are turned off, and the control node of the first transistor and the control node of the second transistor comprise the pair of control nodes of the differential pair input circuit.

10. The differential driver of claim 7, wherein the calibration circuit comprises:
    a comparing circuit, having a first input node coupled to the first output node of the differential pair input circuit for receiving the first output voltage, a second input node coupled to the second output node of the differential pair input circuit for receiving the second output voltage, a third input node for receiving the predetermined voltage, and an output node for outputting a comparison result; and
    a controlling circuit, coupled to the comparing circuit and arranged to adjust the first resistive element and the second resistive element according to the comparison result.

11. The differential driver of claim 10, wherein the comparing circuit comprises:
    an average voltage estimating unit, arranged to generate an average voltage of the first output voltage and the second output voltage; and
    a comparing unit, coupled to the average voltage estimating unit, for generating the comparison result by comparing the average voltage with the predetermined voltage.

12. The differential driver of claim 11, wherein the controlling circuit refers to the comparison result to adjust a resistive value of the first resistive element and a resistive value of the second resistive element for reducing a difference between the average voltage and the predetermined voltage.

13. The differential driver of claim 12, wherein the controlling circuit adjusts the resistive value of the first resistive element and the resistive value of the second resistive element until the average voltage substantially equals the predetermined voltage.

14. The differential driver of claim 11, wherein the controlling circuit increases or reduces both the resistive value of the first resistive element and the resistive value of the second resistive element.

15. A calibration method for calibrating a differential driver with a differential output port including a first output node and a second output node, the calibration method comprising:

receiving a first output voltage corresponding to the first output node and a second output voltage corresponding to the second output node;

generating a comparison result according to the first output voltage, the second output voltage, and a predetermined voltage; and adjusting a first resistive element and a second resistive element according to the comparison result, wherein the first resistive element is coupled between the first output node and a reference voltage, and the second resistive element is coupled between the second output node and the reference voltage;

wherein the differential driver further has a differential input port including a first input node and a second input node, and the calibration method further comprises:

coupling the first input node and the second input node of the differential driver to a same voltage.

16. The calibration method of claim 15, wherein the step of generating the comparison result according to the first output voltage, the second output voltage, and the predetermined voltage comprises:

referring to the comparison result to simultaneously adjust a resistive value of the first resistive element and a resistive value of the second resistive element for calibrating an average value of the resistive value of the first resistive element and the resistive value of the second resistive element to a target value.

17. The calibration method of claim 15, wherein the step of generating the comparison result according to the first output voltage, the second output voltage, and the predetermined voltage comprises:

generating an average voltage of the first output voltage and the second output voltage; and comparing the average voltage with the predetermined voltage to generate the comparison result by.

18. The calibration method of claim 17, wherein the step of adjusting the first resistive element and the second resistive element according to the comparison result comprises:

adjusting a resistive value of the first resistive element and a resistive value of the second resistive element for reducing a difference between the average voltage and the predetermined voltage by referring to the comparison result.

19. The calibration method of claim 18, wherein the step of adjusting the first resistive element and the second resistive element according to the comparison result further comprises:

adjusting the resistive value of the first resistive element and the resistive value of the second resistive element until the average voltage substantially equals the predetermined voltage.

20. The calibration method of claim 18, wherein the step of adjusting the first resistive element and the second resistive element according to the comparison result comprises:

increasing or reducing both the resistive value of the first resistive element and the resistive value of the second resistive element.

21. A calibration circuit for calibrating a differential driver with a differential output port including a first output node and a second output node, the calibration circuit comprising:

a comparing circuit, arranged to receive a first output voltage corresponding to the first output node and a second output voltage corresponding to the second output node, and generate a comparison result according to the first output voltage, the second output voltage, and a predetermined voltage; and a controlling circuit, coupled to the comparing circuit, a first resistive element and a second resistive element, the controlling circuit arranged to adjust the first resistive element and the second resistive element according to the comparison result, wherein the first resistive element is coupled between the first output node and a reference voltage, and the second resistive element is coupled between the second output node and the reference voltage;

wherein the controlling circuit refers to the comparison result to adjust both a resistive value of the first resistive element and a resistive value of the second resistive element for calibrating an average value of the resistive value of the first resistive element and the resistive value of the second resistive element to a target value.

22. A differential driver, comprising:

a first current source, having a first node coupled to a first reference voltage;

a differential pair input circuit, having a common node coupled to a second node of the first current source;

a first resistive element, having a first node coupled to a first output node of the differential pair input circuit, and a second node coupled to a second reference voltage;

a second resistive element, having a first node coupled to a second output node of the differential pair input circuit, and a second node coupled to the second reference voltage, wherein the first output node and the second output node act as a differential output port of the differential driver;

a calibration circuit, arranged to adjust the first resistive element and the second resistive element according to a first output voltage corresponding to the first output node, a second output voltage corresponding to the second output node, and a predetermined voltage; and a second current source, having a first node coupled to a third reference voltage;

wherein the differential pair input circuit comprises:

a first transistor, having a first node coupled to the second node of the first current source, and a second node coupled to the first node of the first resistive element;

a second transistor, having a first node coupled to the second node of the first current source, and a second node coupled to the first node of the second resistive element;

a third transistor, having a first node coupled to a second node of the second current source, and a second node coupled to the first node of the first resistive element; and a fourth transistor, having a first node coupled to the second node of the second current source, and a second node coupled to the first node of the second resistive element;

wherein when the calibration circuit adjusts the first resistive element and the second resistive element, a control node of the first transistor and a control node of the second transistor are coupled to a same voltage to turn on the first transistor and the second transistor, while the third transistor and the fourth transistor are turned off.

23. A calibration method for calibrating a differential driver with a differential output port including a first output node and a second output node, the calibration method comprising:

receiving a first output voltage corresponding to the first output node and a second output voltage corresponding to the second output node;

generating a comparison result according to the first output voltage, the second output voltage, and a predetermined voltage; and adjusting a first resistive element and a second resistive element according to the comparison result, wherein the first resistive element is coupled between the first output node and a reference voltage, and the second resistive element is coupled between the second output node and the reference voltage;

wherein the step of adjusting the first resistive element and the second resistive element comprises:

referring to the comparison result to simultaneously adjust a resistive value of the first resistive element and a resistive value of the second resistive element for calibrating an average value of the resistive value of the first resistive element and the resistive value of the second resistive element to a target value.

* * * * *